United States Patent
Hsieh et al.

(10) Patent No.: US 8,368,094 B2
(45) Date of Patent: Feb. 5, 2013

(54) OPTOELECTRONIC DEVICE

(75) Inventors: Min-Hsun Hsieh, Hsinchu (TW);
Chien-Yuan Wang, Hsinchu (TW);
Jin-Ywan Lin, Hsinchu (TW);
Chiu-Lin Yao, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 202 days.

(21) Appl. No.: 12/813,621

(22) Filed: Jun. 11, 2010

(65) Prior Publication Data

US 2010/0314657 A1    Dec. 16, 2010

(30) Foreign Application Priority Data

Jun. 12, 2009  (TW) ............................... 98119860 A

(51) Int. Cl.
*H01L 33/00* (2010.01)
(52) U.S. Cl. ............... 257/95; 257/98; 257/99; 257/100
(58) Field of Classification Search .................. 257/95, 257/98, 99, 100
See application file for complete search history.

(56) References Cited

U.S. PATENT DOCUMENTS

| | | | | |
|---|---|---|---|---|
| 2005/0199895 A1* | 9/2005 | Seong et al. | ..................... | 257/94 |
| 2005/0199967 A1* | 9/2005 | Hoffman | ....................... | 257/411 |
| 2007/0034857 A1* | 2/2007 | Song | ............................... | 257/13 |
| 2011/0147786 A1* | 6/2011 | Song | ............................... | 257/99 |

FOREIGN PATENT DOCUMENTS

| | | |
|---|---|---|
| CN | 1365153 A | 8/2002 |
| CN | 101308887 A | 11/2008 |
| TW | I258226 | 4/1993 |
| TW | 200616555 A | 4/2008 |

OTHER PUBLICATIONS

The fundamental features of IZO film and study of IZO film contacting GaN. Master's Thesis of Chen-Yao Luo, National Central University, Taiwan, Jul. 2, 2001.
Applications of Ga-doped ZnO Contact on GaN-based LED. Master's Thesis of Yan-shing Lu, National cheng Kung University, Taiwan, 2007.

\* cited by examiner

*Primary Examiner* — Tan N Tran
(74) *Attorney, Agent, or Firm* — Patterson & Sheridan, LLP

(57) ABSTRACT

A optoelectronic device comprises a semiconductor stack layer; a first transparent conductive oxide (abbreviate as "TCO" hereinafter) layer located on the semiconductor stack layer, wherein the first TCO layer has at least one opening; and a second TCO layer covering the first TCO layer, wherein the second TCO layer is filled into the opening of the first TCO layer and contacted with the semiconductor stack layer, and one of the first TCO layer and the second TCO layer forms an ohmic contact with the semiconductor stack layer.

19 Claims, 4 Drawing Sheets

US 8,368,094 B2

OPTOELECTRONIC DEVICE

TECHNICAL FIELD

The application relates to an optoelectronic device, and more particularly to an optoelectronic device including a first transparent conductive oxide layer and a second transparent conductive oxide layer.

REFERENCE TO RELATED APPLICATION

The application claims the right of priority based on TW application Serial No. 098119860 filed on Jun. 12, 2009, which is incorporated herein by reference and assigned to the assignee herein.

DESCRIPTION OF BACKGROUND ART

The lighting theory of light-emitting diode (LED), which is different from that of incandescent lamp, is to generate light by releasing the energy generated from the move of the electron between n type semiconductor and p type semiconductor. So the LED is called a cold lighting source. Furthermore, since LED has advantages as highly durable, long life-time, light weight, low power loss, nowadays LED is highly expected to be a new generation lighting device in the lighting market.

FIG. 1 is a diagram of a conventional optoelectronic element 100 including a substrate 10, a semiconductor stacked layer 12 disposed on the substrate 10, and at least an electrode 14 disposed on the semiconductor stacked layer 12, wherein from top to bottom the semiconductor stacked layer 12 includes a first conductive type semiconductor layer 120, an active layer 122, and a second conductive type semiconductor layer 124.

In the conventional optoelectronic element 100, the surface of the semiconductor stacked layer 12 is flat, and the refractive index of the semiconductor stacked layer 12 is different from that of the external environment, so the light emitted from the active layer has total internal reflection (TIR) easily.

Moreover, when the conventional optoelectronic element 100 is in operation, the current flows into the semiconductor stacked layer 12 via the electrode 14. Most of the current flows in the semiconductor stacked layer 12 by a shortest route, therefore the current distributes in the semiconductor stacked layer 12 unevenly, and the illumination efficiency of the optoelectronic element 100 is affected.

Besides, the optoelectronic element 100 can further connects to other elements to form an optoelectronic apparatus. FIG. 2 is a structure diagram of a conventional optoelectronic apparatus. As shown in FIG. 2, an optoelectronic apparatus 200 includes: a sub-mount 20 at least having a circuit 202; at least a solder 22 disposed on the sub-mount 20 to attach the optoelectronic element 100 on the sub-mount 20, and electrically connects the substrate 10 of the optoelectronic element 100 to the circuit 202; and an electrical connection structure 24 for electrically connecting the electrode 14 of the optoelectronic element 100 to the circuit 202 of the sub-mount 20, wherein the sub-mount 20 can be a lead frame or a mounting structure for circuitry planning of the optoelectronic apparatus 200 and for enhancing the heat-dissipation.

SUMMARY OF THE DISCLOSURE

The present application discloses an optoelectronic element comprising a semiconductor stack layer; a first transparent conductive oxide layer located on the semiconductor stack layer, wherein the first transparent conductive oxide layer has at least an opening; and a second transparent conductive oxide layer covering the first transparent conductive oxide layer, wherein the second transparent conductive oxide layer is filled into the opening of the first transparent conductive oxide layer and contacted with the semiconductor stack layer, and any one of the first transparent conductive oxide layer and the second transparent conductive oxide layer forms an ohmic contact with the semiconductor stack layer.

The present application further discloses an optoelectronic element comprising a semiconductor stack layer; a first transparent conductive oxide layer located on the semiconductor stack layer, wherein the first transparent conductive oxide layer has at least an opening and is in ohmic contact with the semiconductor stack layer; and a second transparent conductive oxide layer covering the first transparent conductive oxide layer, wherein the second transparent conductive oxide layer is filled into the opening.

The present application further discloses an optoelectronic element comprising a semiconductor stack layer; a first transparent conductive oxide layer located on the semiconductor stack layer, wherein the first transparent conductive oxide layer has at least an opening; and a second transparent conductive oxide layer covering the first transparent conductive oxide layer, wherein the second transparent conductive oxide layer is filled into the opening and in ohmic contact with the semiconductor stack layer.

One objective of the present application is to provide an optoelectronic element comprising a first transparent conductive oxide layer having at least an opening to increase the lighting efficiency of the optoelectronic element. The first transparent conductive oxide layer can also form a structure having a plurality of openings.

DETAILED DESCRIPTION OF PREFERRED EMBODIMENTS

Figure 1:
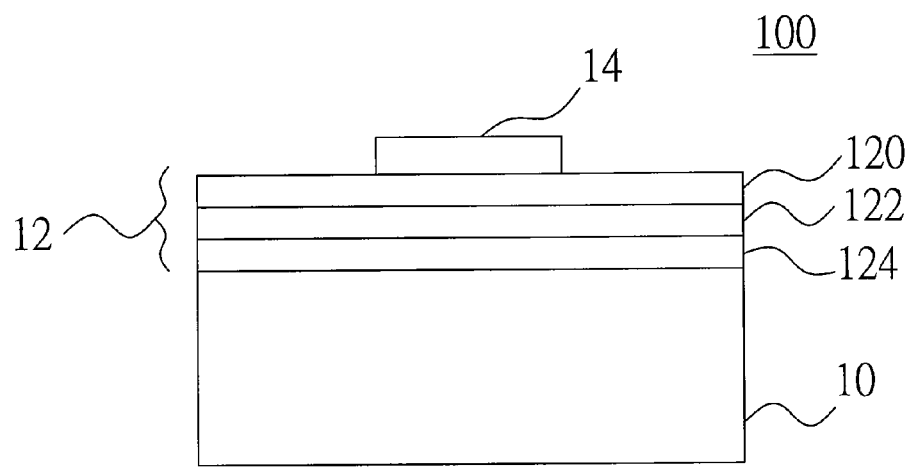
FIG. 1 is a schematic structure diagram of a conventional optoelectronic element.
Figure 2:
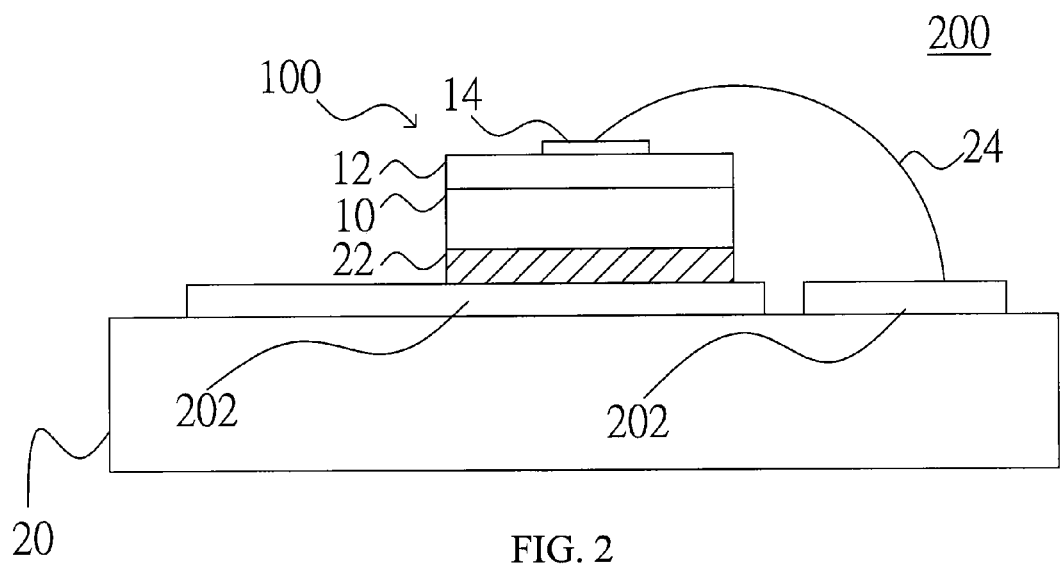
FIG. 2 is a schematic structure diagram of a conventional optoelectronic device.
Figure 3:
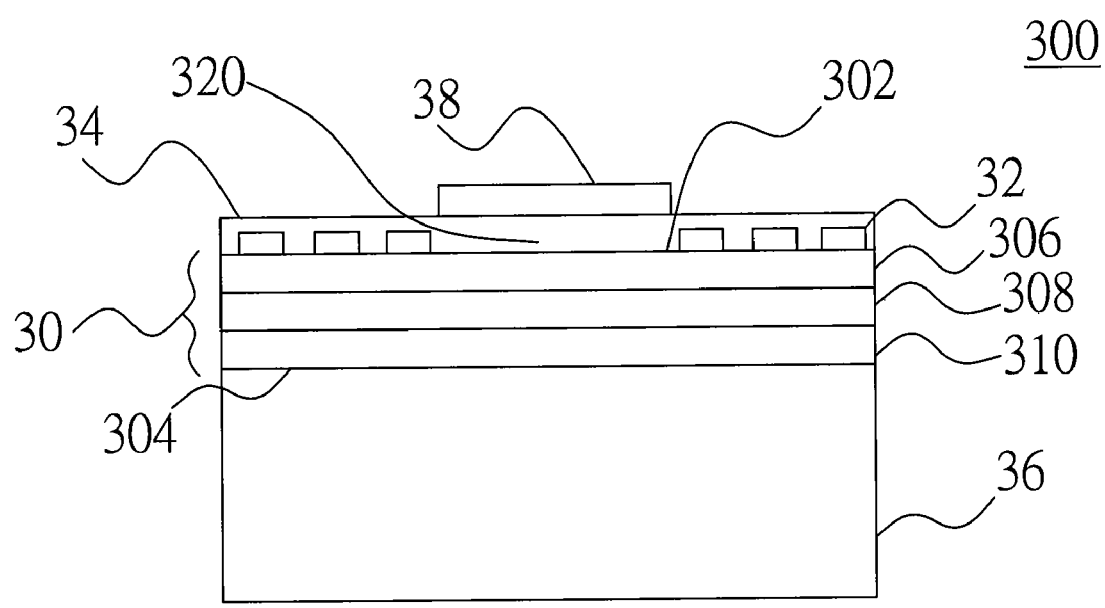
FIG. 3 is a schematic structure diagram of an embodiment of the present application.

FIG. 3 is a schematic structure diagram of an embodiment of the present application. As shown in FIG. 3, an optoelectronic element 300 includes a semiconductor stack layer 30 having a first principal surface 302 and a second principal surface 304; a first transparent conductive oxide layer 32 located on the first principal surface 302 or second principal surface 304; in the present embodiment, the first transparent conductive oxide layer 32 is located on the first principal surface 302; and a second transparent conductive oxide layer 34 covering the first transparent conductive oxide layer 32 to form a surface substantially parallel to the first principal surface 302 or the second principal surface 304, wherein the first transparent conductive oxide layer 32 further includes a plurality of openings 320 thereon, and the second transparent conductive oxide layer 34 is filled into the openings 320 of the first transparent conductive oxide layer 32 and in contact with the semiconductor layer 30, wherein the first transparent conductive oxide layer 32 or the second transparent conductive oxide layer 34 can form an ohmic contact with the semiconductor stack layer 30. In the present embodiment, the first transparent conductive oxide layer 32 forms an ohmic contact with the semiconductor stack layer 30 for an electrical connection, and where the second transparent conductive oxide layer 34 in contact with the semiconductor stack layer 30 does not form an ohmic contact but a schottky contact.

Additionally, the optoelectronic element 300 further includes a substrate 36 located under the second principal surface 304, and an electrode 38 located on the second transparent conductive oxide layer 34, wherein the electrode 38 is located directly above the opening 320 of the first transparent conductive oxide layer 32.

The semiconductor stack layer 30 from top to bottom can include a first conductive type semiconductor layer 306, an active layer 308, and a second conductive type semiconductor layer 310. The material of the semiconductor stack layer 30 is selected from the III-V group materials, for example, the semiconductor materials contain Al, Ga, In, N, P or As, such as GaN series, AlGaInP series or GaAs series; and the materials of the first transparent conductive oxide layer 32 and the second transparent conductive oxide layer 34 can be ITO, InO, SnO, CTO, ATO, AZO, or ZnO, wherein the grain size or the reflective index of the first transparent conductive oxide layer 32 differs from that of the second transparent conductive oxide layer 34. The first transparent conductive oxide layer 32 and the second transparent conductive oxide layer 34 have different composing materials, or have the same composing materials but different composing percentage. The first transparent conductive oxide layer 32 and the second transparent conductive oxide layer 34 can form an ohmic contact therebetween to promote current spreading effect.

Additionally, the first transparent conductive oxide layer 32 has a plurality of openings 320, and the top surface of the second transparent conductive oxide layer 34 that fills into the opening 320 and covers the first transparent conductive oxide layer 32 can be a flat surface substantially parallel to the first principal surface 302 or the second principal surface 304, or a roughing surface (not shown) to reduce the probability of total reflection for the light emitted from the optoelectronic element 300, therefore raising the light extraction efficiency of the optoelectronic element 300.

Moreover, in the present embodiment, the first transparent conductive oxide layer 32 forms an ohmic contact with the semiconductor stack layer 30 for forming an electrical connection, and the contact between the second transparent conductive oxide layer 34 and the semiconductor stack layer 30 is not ohmic but such as a schottky contact. When flowing into the optoelectronic element 300, the current is conducted into the second transparent conductive oxide layer 34 via the electrode 38. However, as the contact between the second transparent conductive oxide layer 34 and the semiconductor stack layer 30 is not ohmic, and the contact between the first transparent conductive oxide layer 32 and the semiconductor stack layer 30 is ohmic, so the current flowing through the second transparent conductive oxide layer 34 can be conducted into the semiconductor stack layer 30 via the first transparent conductive oxide layer 32. If the electrode 38 of the optoelectronic element 300 is located directly above the opening 320 of the first transparent conductive oxide layer 32, the current spreading effect can be much improved, therefore the light-emitting efficiency of the optoelectronic element 300 in enhanced.

Figure 4A:
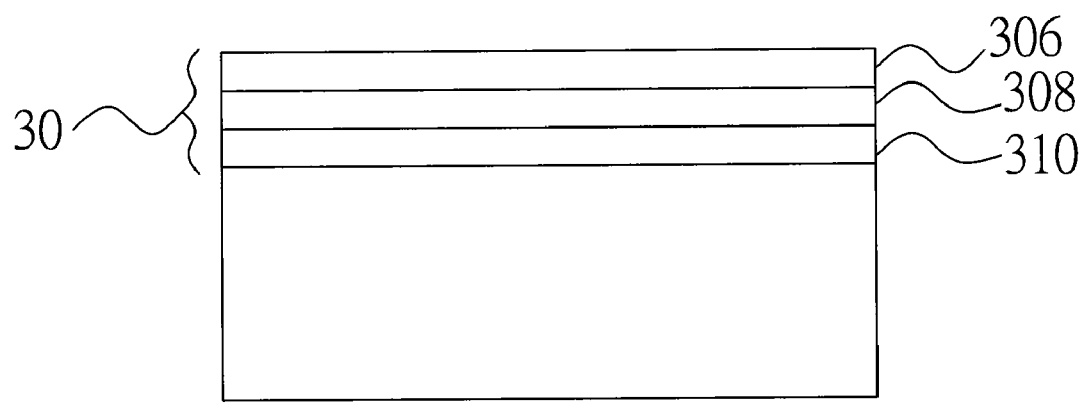
FIGS. 4A to 4D are fabrication flow diagrams of an embodiment of the present application.
Figure 4B:
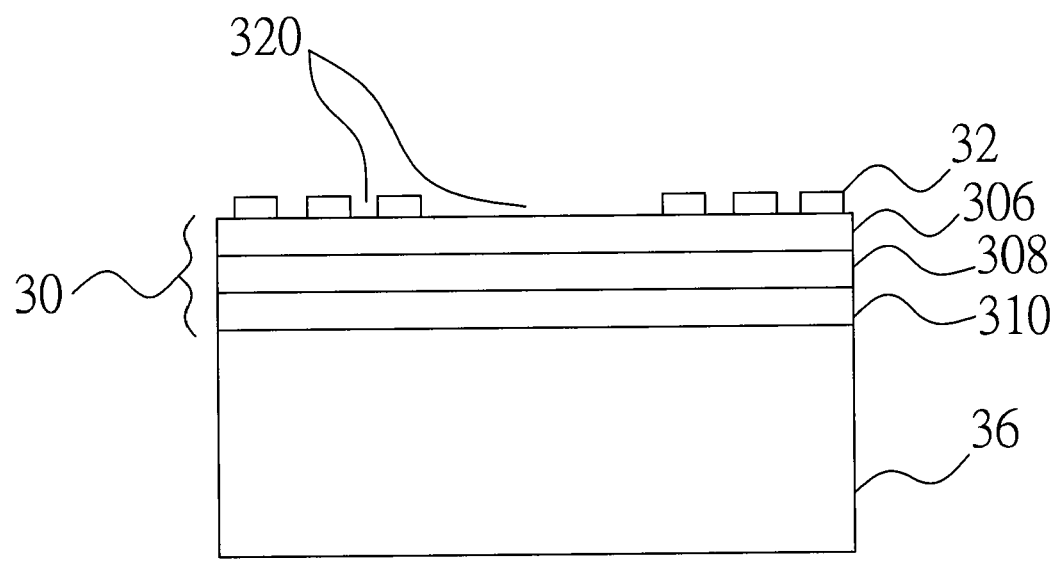
Figure 4C:
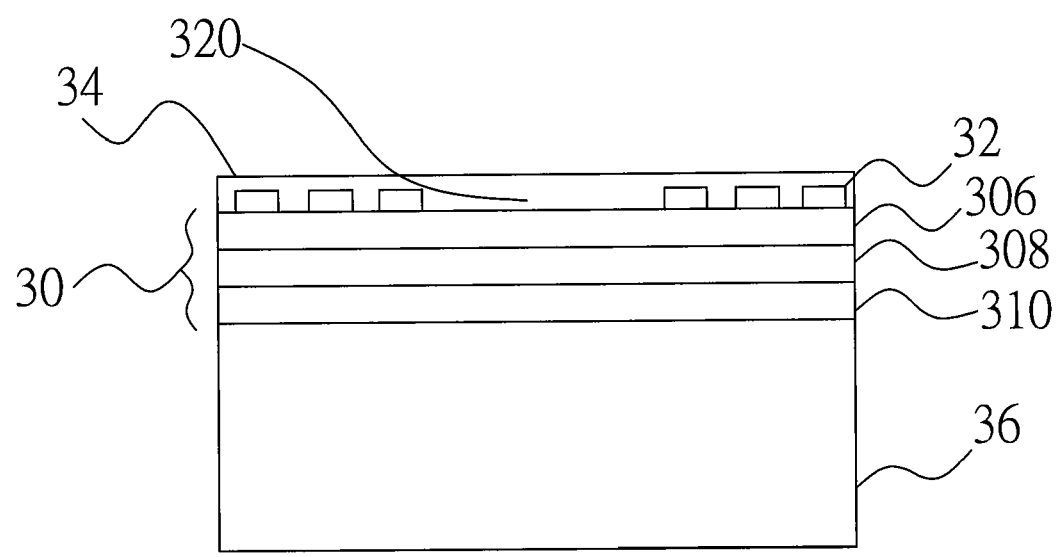
Figure 4D:
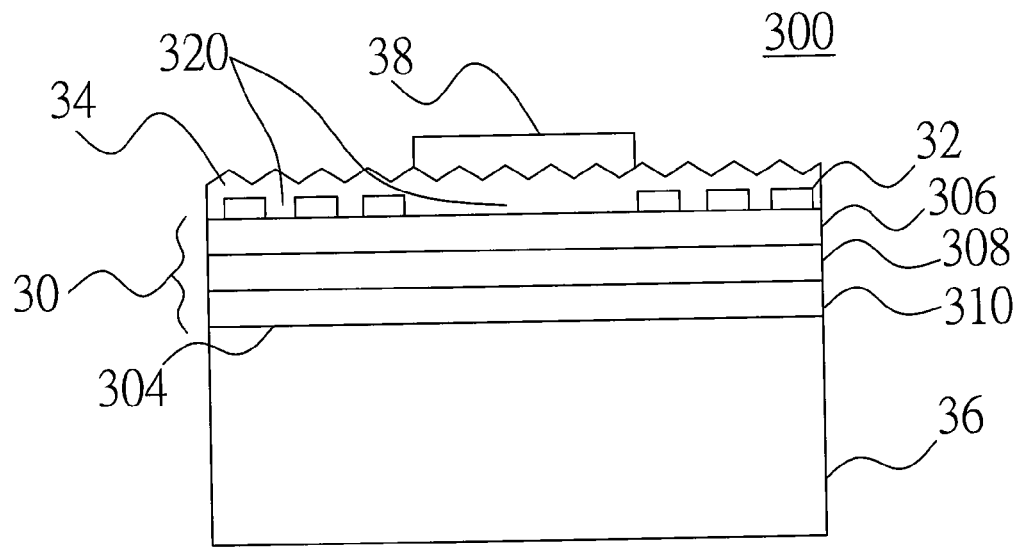

FIG. 4A to FIG. 4D are the fabrication flow diagram of the optoelectronic element 300. As shown in FIG. 4A, a substrate 36 is firstly provided, and a semiconductor stack layer 30 is formed on the substrate 36 by Metal Organic Chemical Vapor Deposition (MOCVD) or Liquid Phase Epitaxy (LPE), wherein the semiconductor stack layer 30 includes a first conductive type semiconductor layer 306, an active layer 308, and a second conductive type semiconductor layer 310. Then, as shown in FIG. 4B, a first transparent conductive oxide layer 32 formed on the semiconductor stack layer 30 by e-beam vapor deposition or sputtering deposition, and a plurality of openings 320 exposing the semiconductor stack layer 30 are formed on the first transparent conductive oxide layer 32 by photo-lithography etching technology, wherein the an ohmic contact is formed at the interface between the first transparent conductive oxide layer 32 and the semiconductor stack layer 30. Then, as shown in FIG. 4C, a second transparent conductive oxide layer 34 is formed on the first transparent conductive oxide layer 32 by applying e-beam vapor deposition or sputtering deposition, wherein the second transparent conductive oxide layer 34 covers the first transparent conductive oxide layer 32 and fills into the plurality of the openings 320 and is in contact with the semiconductor stack layer 30. Besides, by adjusting the forming method or fabrication process parameters, such as controlling gas species or flow rate, reactor temperature or pressure, and/or annealing temperature or time, the second transparent conductive oxide layer 34 does not form an ohmic contact with the semiconductor stack layer 30. In the present embodiment, the second transparent conductive oxide layer 34 is positioned in an environment having sufficient nitrogen and is partially processed by laser annealing, so the second transparent conductive oxide layer 34 does not form an ohmic contact with the semiconductor stack layer 30. Finally, as shown in FIG. 4D, a roughing structure is formed on the top surface of the second transparent conductive oxide layer 34 by etching, and an electrode 38 is formed on the second transparent conductive oxide layer 34, wherein the electrode 38 is located opposite to the opening 320 of the first transparent conductive oxide layer 32, and the optoelectronic element 300 is formed accordingly.

Figure 5:
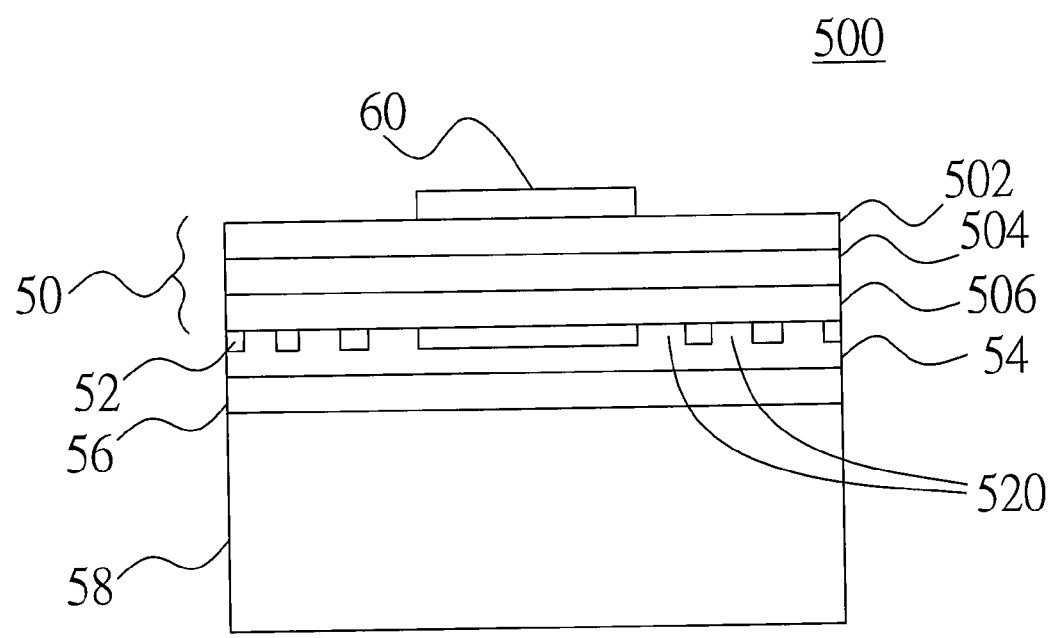
FIG. 5 is a schematic structure diagram of another embodiment of the present application.

FIG. 5 is a schematic structure diagram of another embodiment of the present application. As shown in FIG. 5, an optoelectronic element 500 at least includes a semiconductor stack layer 50, a first transparent conductive oxide layer 52 located on the bottom surface of the semiconductor stack layer 50, and a second transparent conductive oxide layer 54 located under the first transparent conductive oxide layer 52, wherein the semiconductor stack layer 50 at least includes a first conductive type semiconductor layer 502, an active layer 504, and a second conductive type semiconductor layer 506. The first transparent conductive oxide layer 52 has a plurality of openings 520, the second transparent conductive oxide layer 54 is filled into the openings 520 and is in contact with the semiconductor stack layer 50, so there is no ohmic contact formed between the first transparent conductive oxide layer 52 and the semiconductor stack layer 50 but non-ohmic contact like schottky contact, and there is ohmic contact formed between the second transparent conductive oxide layer 54 and the semiconductor stack layer 50.

The material of the semiconductor stack layer 50 can be III-V group semiconductor materials, containing Al, Ga, In, N, P or As, such as GaN series, AlGaInP series or GaAs series, and the materials of the first transparent conductive oxide layer 52 and the second transparent conductive oxide layer 54 can be ITO, InO, SnO, CTO, ATO, AZO, or ZnO, wherein the grain size or the reflective index of the first transparent conductive oxide layer 52 differs from that of the second transparent conductive oxide layer 54. The first transparent conductive oxide layer 52 and the second transparent conductive oxide layer 54 have different composing materials, or have the same composing materials but different composing ratio. The first transparent conductive oxide layer 52 and the second transparent conductive oxide layer 54 can form an ohmic contact therebetween to promote current spreading effect.

Additionally, the optoelectronic element 500 further includes a conductive adhesion layer 56 located under the second transparent conductive oxide layer 54, a substrate 58 located under the conductive adhesion layer 56, and an electrode 60 located on the semiconductor stack layer 50, wherein the electrode 60 is located directly above the first transparent conductive oxide layer 52. The interface of the first transparent conductive oxide layer 52 and the semiconductor stack layer 50 dose not form an ohmic contact, so when the current flows into the semiconductor stack layer 50 from the electrode 60, it flows to the conductive adhesion layer 56 and the substrate 58 via the second transparent conductive oxide layer 54 filled into the openings 520. Because the electrode 60 is located directly above the first transparent conductive oxide layer 52, most current does not directly flow through the active layer 504 under the electrode 60, therefore the current spreads effectively.

What is claimed is:

1. An optoelectronic element comprising:
    a semiconductor stack layer comprising a first surface and a second surface;
    a first transparent conductive oxide layer located on the first surface of the semiconductor stack layer, wherein the first transparent conductive oxide layer comprises at least an opening exposing the first surface of the semiconductor stack layer; and
    a second transparent conductive oxide layer filled into the opening and covering the first transparent conductive oxide layer, wherein any one of the first transparent conductive oxide layer and the second transparent conductive oxide layer forms an ohmic contact with the semiconductor stack layer.

2. The optoelectronic element of claim 1, wherein the semiconductor stack layer comprises a first conductive type semiconductor layer, an active layer located on the first conductive type semiconductor layer, and a second conductive type semiconductor layer located on the active layer.

3. The optoelectronic element of claim 1, wherein the material of the semiconductor stack layer comprises a semiconductor material containing more than one element selected from a group consisting of Al, Ga, In, N, P and As.

4. The optoelectronic element of claim 1, wherein the first transparent conductive oxide layer and the second transparent conductive oxide layer comprise the same composing material with different refractive indexes and/or different grain sizes.

5. The optoelectronic element of claim 1, further comprising an electrode located on the second transparent conductive oxide layer, wherein the electrode is located directly above the first transparent conductive oxide layer or directly above the opening of the first transparent conductive oxide layer.

6. The optoelectronic element of claim 1, wherein the material of the first transparent conductive oxide layer and the second transparent conductive oxide layer comprise ITO, InO, SnO, CTO, ATO, AZO, or ZnO.

7. The optoelectronic element of claim 1, wherein the interface between the second transparent conductive oxide layer and the semiconductor stack layer forms a schottky contact.

8. The optoelectronic element of claim 1, wherein the first transparent conductive oxide layer forms an ohmic contact with the second transparent conductive oxide layer.

9. The optoelectronic element of claim 1, wherein the opening is formed through the first transparent conductive oxide layer.

10. The optoelectronic element of claim 1, further comprising:
    an electrode located on the second transparent conductive layer, wherein the entirety of the electrode is directly above the opening.

11. An optoelectronic element comprising:
    a semiconductor stack layer comprising a first surface and a second surface;
    a first transparent conductive oxide layer located on the first surface of the semiconductor stack layer, wherein the first transparent conductive oxide layer comprises at least an opening, and the first transparent conductive oxide layer forms an ohmic contact with the semiconductor stack layer; and
    a second transparent conductive oxide layer covering on the first transparent conductive oxide layer and filled into the opening, and forming a contact with the semiconductor stack layer, wherein the first transparent conductive oxide layer and the second transparent conductive oxide layer are composed of different materials or composed of the same material but having different composition ratios.

12. The optoelectronic element of claim 11, wherein the semiconductor stack layer comprises:
    a first conductive type semiconductor layer;
    an active layer located on the first conductive type semiconductor layer; and
    a second conductive type semiconductor layer located on the active layer.

13. The optoelectronic element of claim 11, wherein the first transparent conductive oxide layer and the second transparent conductive oxide layer comprise the same composing material with different refractive indexes and/or different grain sizes.

14. The optoelectronic element of claim 11, wherein the top surface of the second transparent conductive oxide layer is a roughing surface.

15. The optoelectronic element of claim 11, further comprising an electrode located on the second transparent conductive oxide layer, wherein the electrode is located directly above the opening of the first transparent conductive oxide layer.

16. The optoelectronic element of claim 11, wherein the contact is a schottky contact.

17. The optoelectronic element of claim 11, wherein the first transparent conductive oxide layer forms an ohmic contact with the second transparent conductive oxide layer.

18. The optoelectronic element of claim 11, wherein the opening is formed through the first transparent conductive oxide layer.

19. The optoelectronic element of claim 11, further comprising:
    an electrode located on the second transparent conductive layer, wherein the entirety of the electrode is directly above the opening.

* * * * *